United States Patent
Matsuo et al.

(10) Patent No.: US 6,574,447 B2
(45) Date of Patent: Jun. 3, 2003

(54) LASER BEAM EMISSION CONTROL FOR ELECTROPHOTOGRAPHIC DEVICE

(75) Inventors: Kazuyoshi Matsuo, Hitachi (JP); Makoto Otaka, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/972,998

(22) Filed: Oct. 10, 2001

(65) Prior Publication Data

US 2002/0101495 A1 Aug. 1, 2002

(30) Foreign Application Priority Data

Jan. 29, 2001 (JP) ........................................ 2001-019390

(51) Int. Cl.[7] ............................................... G03G 15/00
(52) U.S. Cl. ....................................................... 399/132
(58) Field of Search ................................. 347/132, 133, 347/246, 247; 250/205; 372/29.014

(56) References Cited

U.S. PATENT DOCUMENTS 5,473,153 A * 12/1995 Araki et al. ................. 250/205
6,029,033 A * 2/2000 Kawasaki .................... 399/299

* cited by examiner

Primary Examiner—Joan Pendegrass
(74) Attorney, Agent, or Firm—Antonelli, Terry, Stout & Kraus, LLP

(57) ABSTRACT

In an electrophotographic device, a method is provided in which laser power is regulated at two predetermined points of gradation. More specifically, a first laser power regulating means which regulates the magnitude of a laser power output and a second laser power regulating means which regulates the slope of laser power gradation characteristic are provided. Thereby, stabilization of the laser power output value is realized at any stage of the gradation, and an electrophotographic device can be provided which reduces variability in image quality between electrophotographic devices.

2 Claims, 5 Drawing Sheets

LASER BEAM EMISSION CONTROL FOR ELECTROPHOTOGRAPHIC DEVICE

BACKGROUND OF THE INVENTION

The present invention relates to an electro-photographic device, and, in particular, it relates to a laser power regulating means for laser control and a method therefor.

With regard to laser power setting for an electrophotographic device, control of the amount of laser beam emission is performed by making use of a monitor current Im which is generated at a monitor pin photo diode provided in a laser diode. More specifically, after converting the monitor current into a voltage, the output thereof is controlled by feeding back the same to a regulation circuit in a laser power output control means. In the regulation circuit, the current which is to flow into the laser diode itself is controlled so as to keep the fed back voltage at a predetermined value. In order to convert the monitor current to a voltage a resistor is added; however, because of the variability in the monitor current characteristic of a laser diode, a fine adjustment is generally performed by making use of a variable resistor.

Further, in order to control the laser power variably, a reference signal is fetched and the gradation of the laser power is set. Depending on the condition and environment of the electrophotographic device, the laser power is varied, to thereby stabilize the image quality thereof.

In the laser beam emission control means provided with the above-described conventional gradation, the regulation center of the laser power is positioned at the center of the gradation, and the regulation is performed by the added variable resistor for converting the monitor current to a voltage, so as to obtain a predetermined output value. With regard to the gradation characteristic of laser power regulated using such a method, the laser power variability between electro-photographic devices increases as the regulation moves away from the center of the gradation. Because there is a variability in the characteristic between monitor current and slope efficiency (variation rate of laser beam emission amount with respect to the current flowing through a laser diode) of the laser diode, the slope of the laser power gradation is determined depending on the above characteristic. As a result, there arises a problem in that the tint of the final output images differs between electrophotographic devices.

SUMMARY OF THE INVENTION

An object of the present invention is to stabilize the laser power output value at any stage of the gradation and to reduce the variability in image quality between electrophotographic devices.

In order to resolve the above-described conventional problems, the present invention proposes a method in which laser power is regulated at two predetermined points of the gradation. More specifically, in accordance with the present invention, a first laser power regulating means, which regulates the magnitude of laser power output, and a second laser power regulating means which regulates the slope of laser power gradation characteristic, are provided.

DETAILED DESCRIPTION OF PREFERRED EMBODIMENT

An embodiment of the present invention will be explained with reference to FIGS. 1 through 9.

Figure 5:
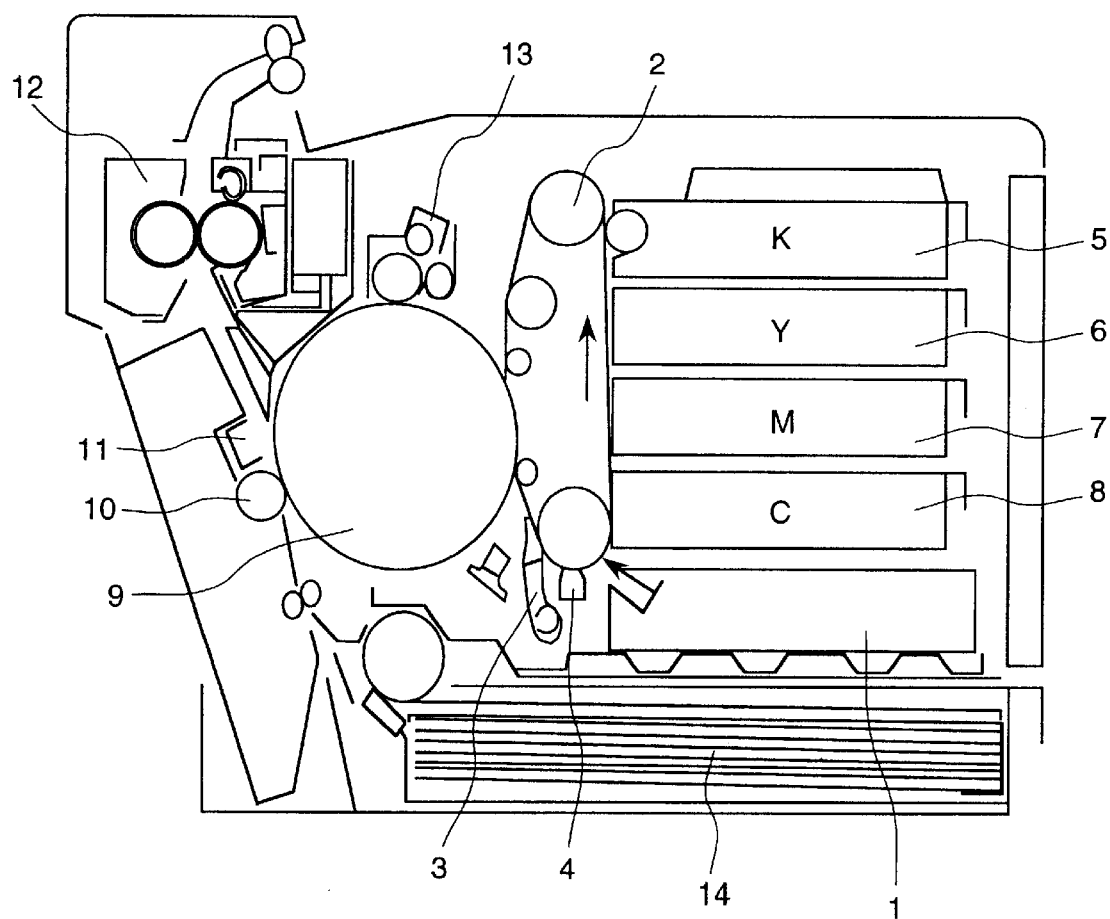
FIG. 5 is a schematic diagram showing the overall structure of an electrophotographic device.

At first, an example of the overall structure of an electrophotographic device to which the present invention is applied will be described with reference to FIG. 5. A photo-sensitive belt 2, on the surface of which an organic photo conductive material (OPC) is coated, is rotatably driven in the arrowed direction during an image forming operation. A belt cleaner 3 removes any remaining toner on the photosensitive belt 2 after completing toner image formation. A charger 4 charges the surface of the photosensitive belt 2 with electric charges necessary for forming an electrostatic latent image on the surface of the photosensitive belt 2. Laser beams emitted from an optical unit 1 expose the charged surface of the photosensitive belt 2 to form an electrostatic latent image thereon. Developers 5–8 develop the electrostatic latent image formed on the photosensitive belt 2 using respective color toners successively in the following order, firstly by black toner, secondly by cyan, thirdly by magenta and fourthly by yellow. An intermediate transfer drum 9 rotates through contact with the photosensitive belt 2, and the toner image formed on the surface of the photosensitive belt 2 is transferred on the intermediate transfer drum 9 in the order of black, cyan, magenta and yellow (first transfer) to overlap the same and to form a color toner image. A transfer roller 10 transfers the color toner image formed on the intermediate transfer drum 9 on to a recording medium 14 by applying electric field of opposite polarity from the back side of the recording medium 14 (second transfer). A fixing unit 12 melts and fixes the toner transferred on the recording medium 14 by heating and pressing. A drum cleaner 13 removes toner remaining on the intermediate transfer drum 9 after the color toner image on the intermediate transfer drum 9 has been transferred onto the recording medium 14.

Figure 4:
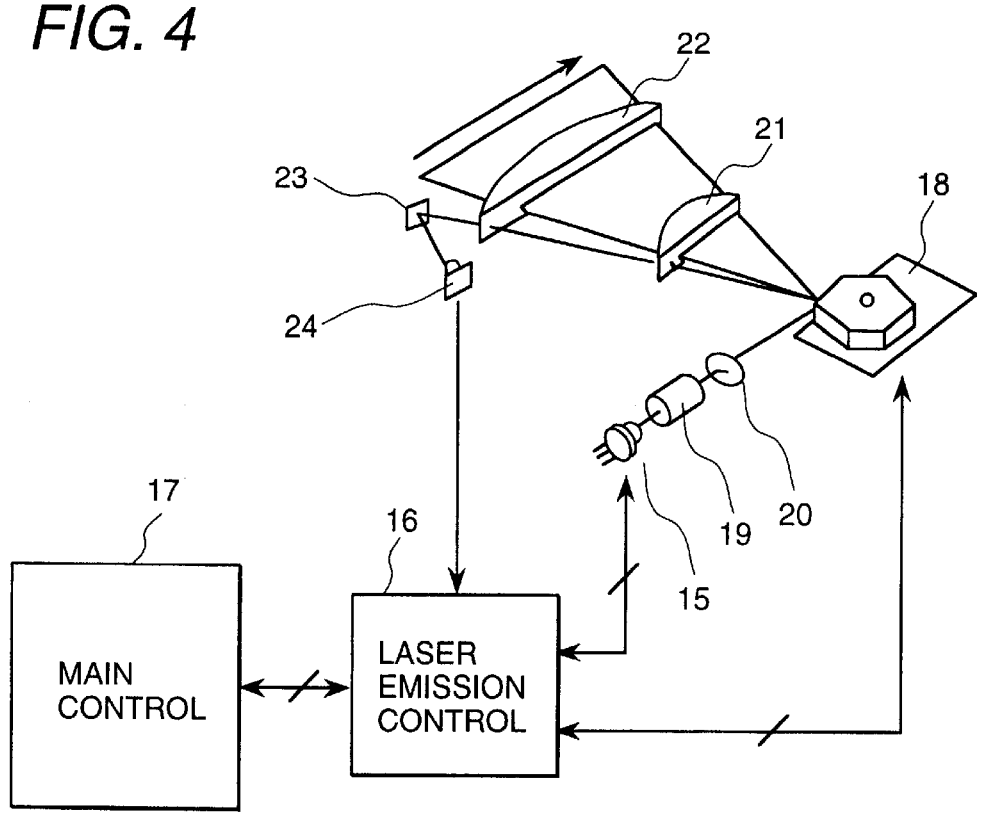
FIG. 4 is a schematic diagram showing the structure of is an optical unit including a laser beam emission control means.

Now, the structure of the optical unit 1 will be explained with reference to FIG. 4. Actually, a laser diode is mounted on a circuit substrate in a laser beam emission control means 16, and operations, such as ON/OFF of laser beam emission and laser power regulation thereof, are performed by a command from a main control means 17. The emitted laser beams are directed into a collimator 19 to be converged therein. The converged laser beams pass a slit 20 and are irradiated on the mirror face of a polygon scanner motor 18. A drive signal for the polygon scanner motor 18 is sent from the main control means 17 via the laser beam emission control means 16. The laser beams scanned through rotation of the polygon mirror pass through an F-θ lens 21 and a cylinder lens 22 and are irradiated on the photosensitive belt (not shown). The laser beams at the head of every one scanning line are incident on a BDT detection means 24, after being reflected by a reflection mirror 23. The BDT detection means 24 functions to create a home position signal for starting image data transmission of one line. The home position signal is also input to the main control means 17 via the laser beam emission control means 16.

Figure 1:
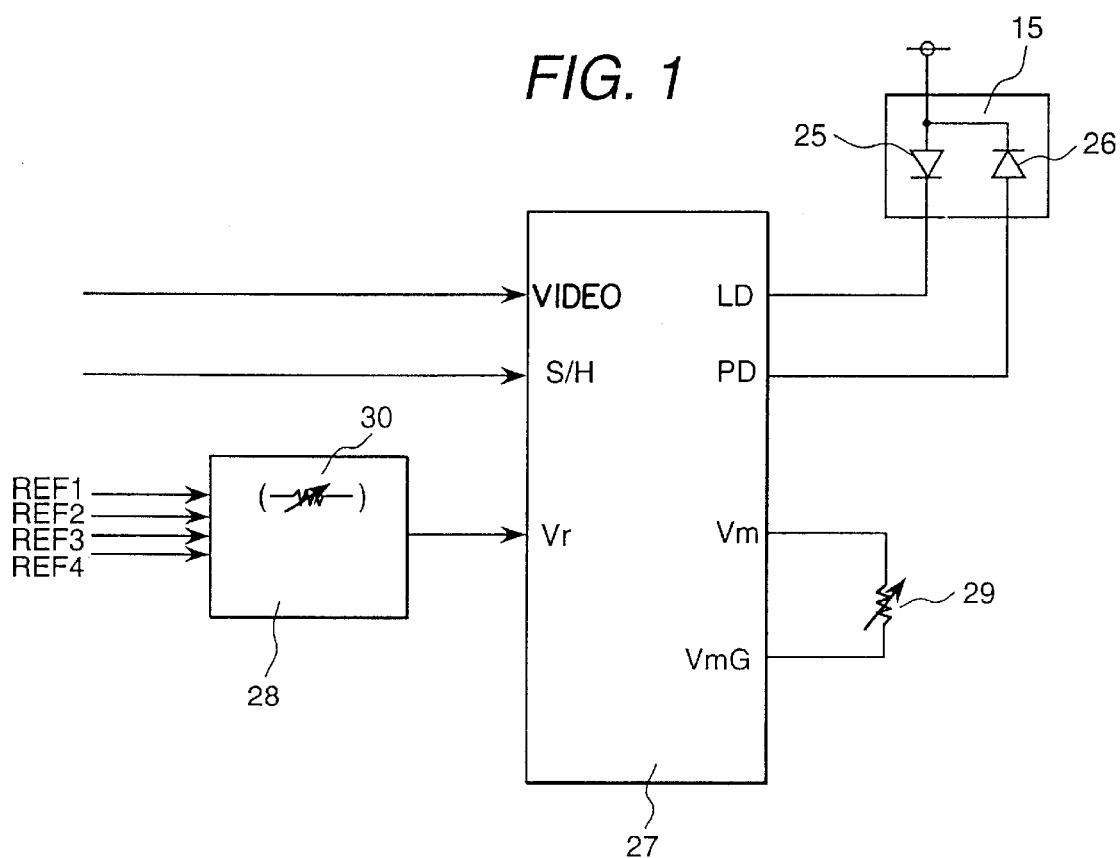
FIG. 1 is a schematic diagram showing the circuit structure of a laser beam emission control means.

Details of the laser beam emission means 16 will be explained with reference to FIG. 1. The operation of the laser beam emission control itself is performed by a dedicated laser control IC (laser power output control means) 27. The laser element 25 of the laser diode 15 is connected to an LD terminal and the pin photo diode 26 thereof is connected to a PD terminal of the laser control IC27. A variable resistor (a first laser power regulation means) 29 is connected between terminals Vm and VmG of the laser control IC 27. A laser power gradation setting means 28 for setting the laser power gradation is connected to a terminal Vr of the laser control IC27. The laser control IC 27 is controlled by a state command signal through terminal S/H (regulation/hold). Laser beam emission is controlled by the ON/OFF states of the VIDEO signal. An operation of setting the laser power output at a predetermined value is performed by bringing the laser control IC 27 into a regulation mode at first by shifting the state of command S/H to the L state. Subsequently, through shifting the VIDEO signal to the L state, laser beams are emitted. In this case, current is drawn into the LD terminal to cause the laser element 25 to produce laser beam emission. When the laser beams are emitted, a monitor current is caused to flow through the pin photo diode 26 depending on the amount of laser beam emission. The monitor current flows into the variable resistor 29 via the laser control IC 27 to generate a voltage thereat. The laser control IC 27 automatically controls the current value drawn in from the terminal LD so that the gradation data voltage inputted at the terminal Vr assumes the same voltage value as the monitor voltage Vm. When the voltages Vr and Vm assume the same value, the laser diode emits beams at a constant power, thus, the state command signal S/H is changed to the H state to bring the laser control IC into a hold state. From this moment on, when repeating ON/OFF operation of the VIDEO signal, the laser diode 15 can emit beams at a constant power. The laser power can be set either by a method in which the monitor current is varied by the variable resistor 29 or by a method in which the voltage value Vr representing the gradation data is varied.

Figure 2:
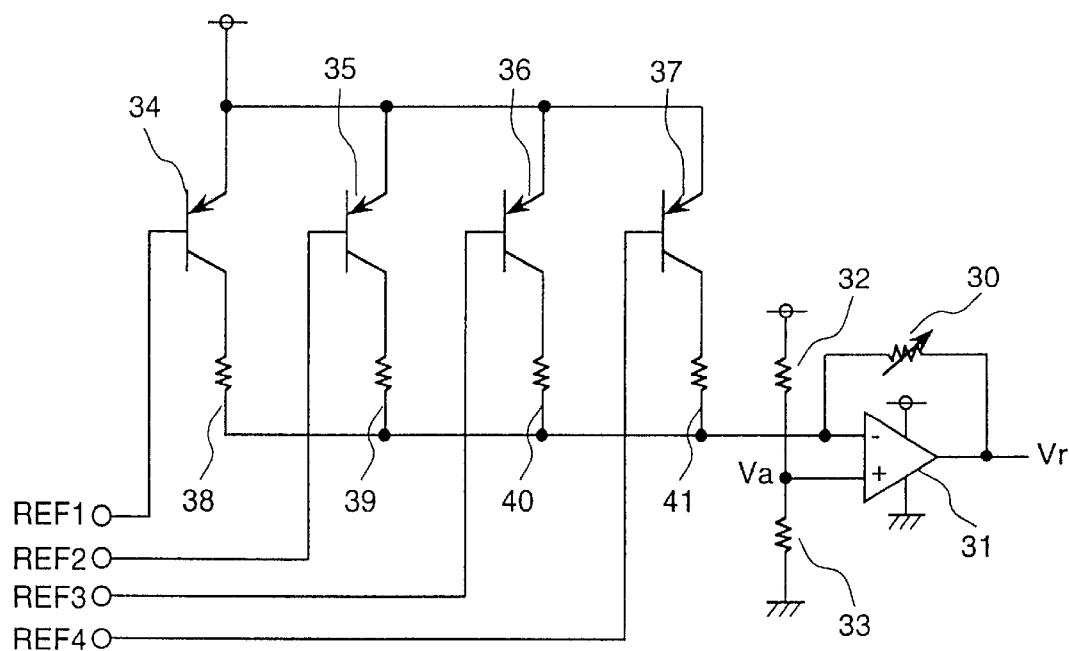
FIG. 2 is a schematic diagram of a laser power gradation setting circuit of the present invention.
Figure 9:
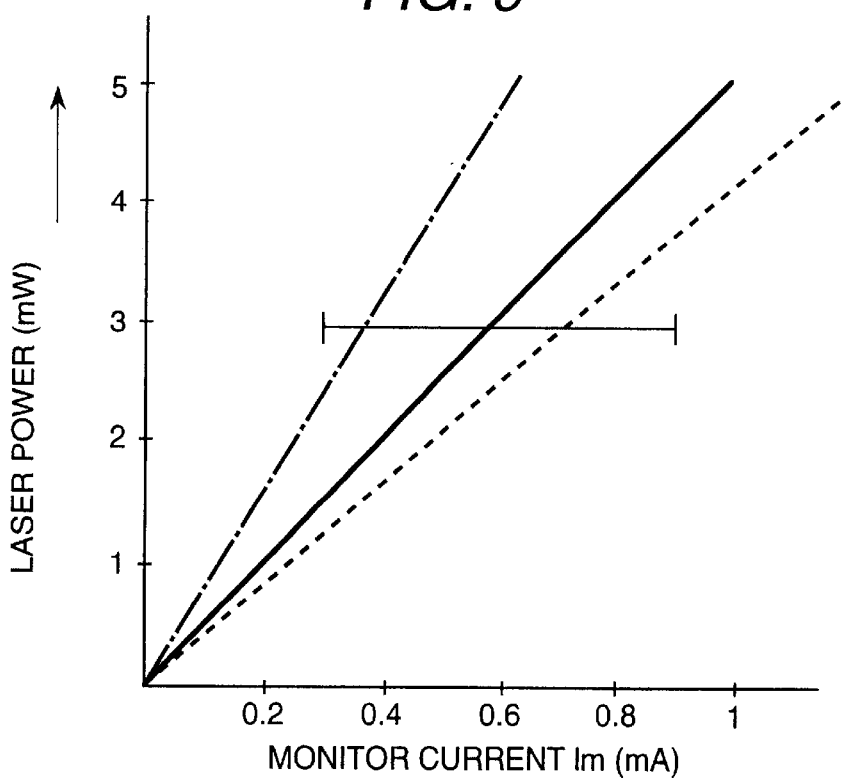
FIG. 9 is a graph showing a characteristic of laser diode monitor current versus laser power.

A detailed circuit diagram of the laser power gradation setting means 28 will be explained with reference to FIG. 2. The illustrated circuit is a current voltage conversion circuit which makes use of an OP amplifier 31. Resistors 32 and 33 set a reference voltage Va. Resistors 38–41 perform a weighting function for converting digital signals of REF1–4 into analogue signals. Transistors 34–37 are turned ON/OFF by the signals REF1–4 to set 16 gradations of 4 bits. The number REF signals is not limited to four, so that, if the number of bits is increased, the stages of the gradations can be increased. The variable resistor 30 is the second laser power regulating means of the present invention. In the conventional method, since an invariable resistor is used for the corresponding resistor, the laser power gradation depends on the characteristic of the laser diode itself. A laser diode characteristic which greatly affects the gradation characteristic is a monitor current characteristic as shown in FIG. 9. With regard to 5 mW class laser diodes of respective manufacturers, specifications of monitor current for obtaining a laser power of 3 mW are in a range of 0.3–0.9 mmA. This range looks narrow at first glance, however, the range is very broad for the laser power regulation, and the variability of laser diodes for every lot is significant. Further, as will be seen from the laser drive current characteristic shown in FIG. 8, the laser power variation rate with respect to the laser drive current (slope efficiency) affects not a little on the gradation setting.

Figure 7:
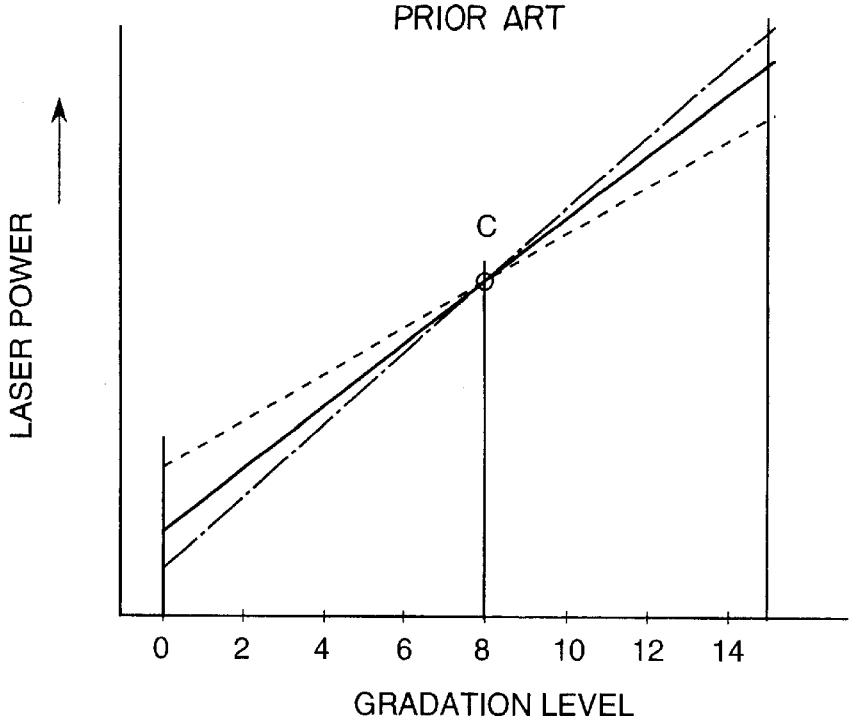
FIG. 7 is a graph showing laser power gradation characteristic when regulation is performed according to the conventional method.
Figure 8:
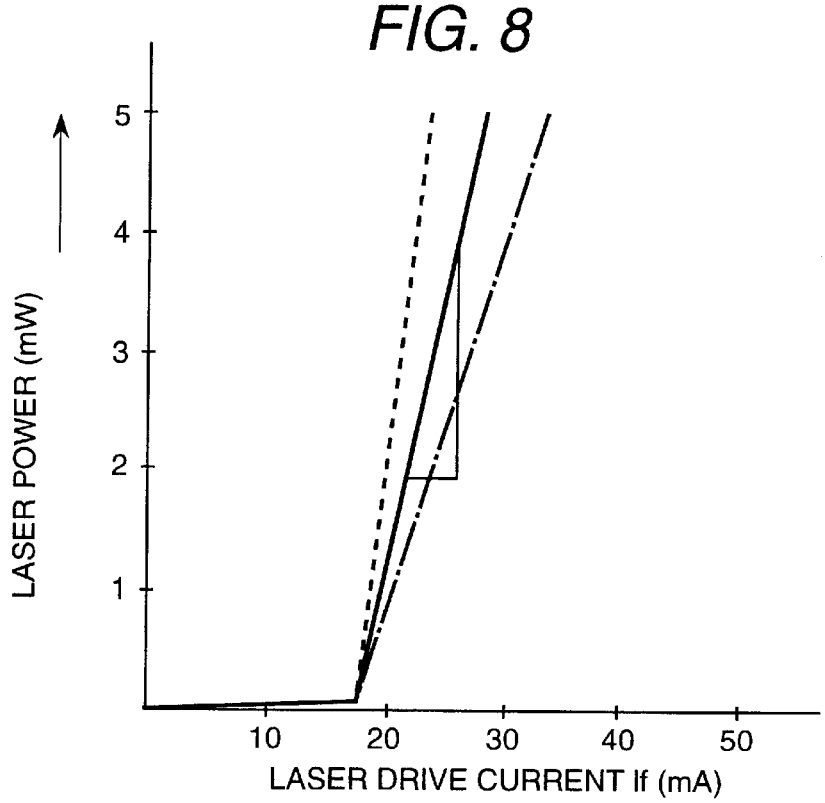
FIG. 8 is a graph showing a characteristic of laser diode drive current versus laser power.

FIG. 7 shows laser power with respect to gradation level, when the regulation is performed according to the conventional method. In the conventional regulation method, the regulation is performed only by making use of the variable resistor 29 (in the conventional method the resistor 30 is an invariable resistor) based on the REF data at a notch 8 corresponding to the center of the gradation, thereby, variabilities are caused, as shown by a dotted line and a broken line with respect to an ideal solid line.

Figure 3:
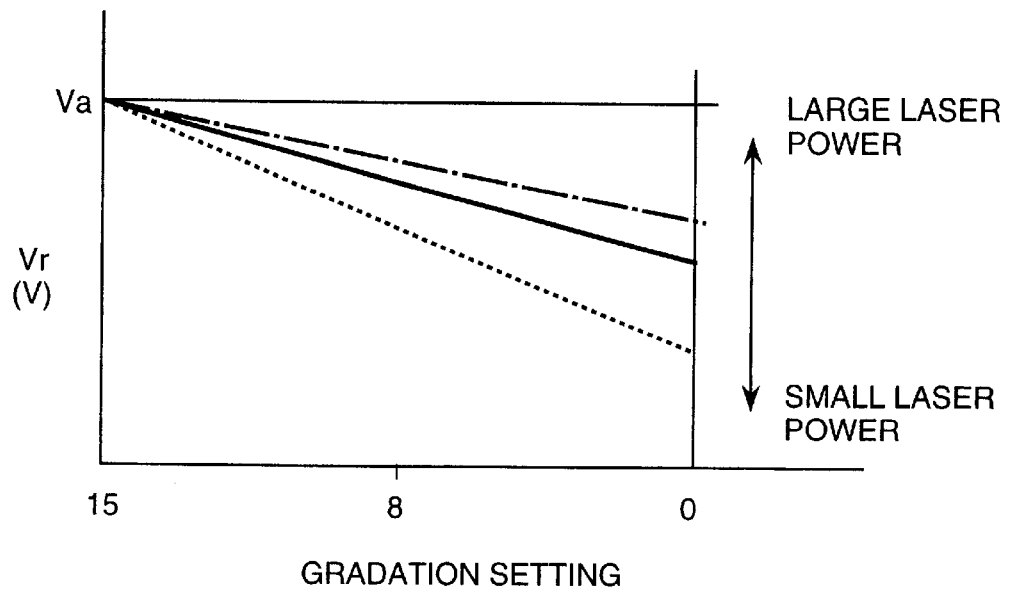
FIG. 3 is a graph of the voltage setting in the laser power gradation setting versus gradation setting circuit.
Figure 6:
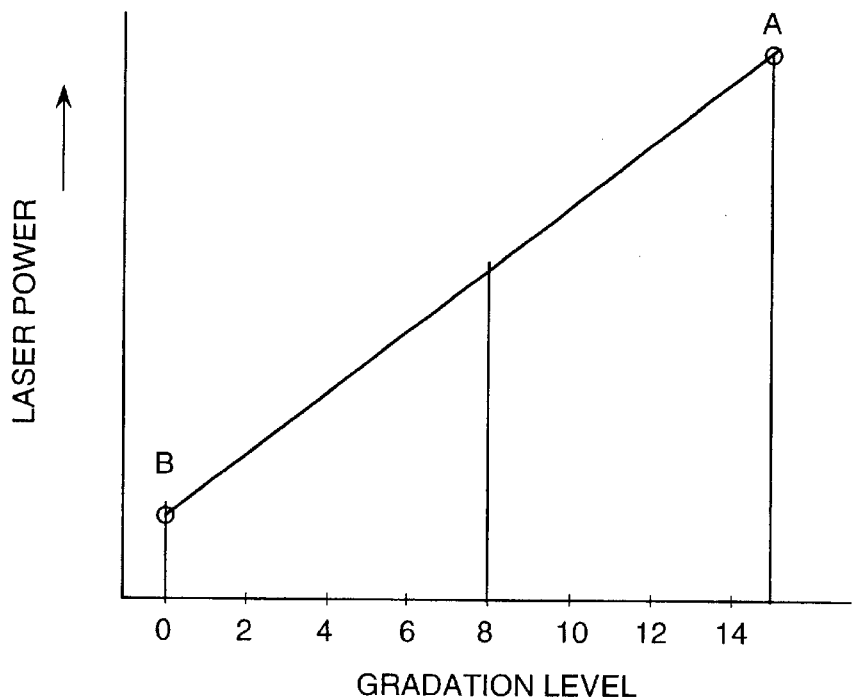
FIG. 6 is a graph showing a laser power gradation characteristic when regulation is performed according to the method of the present invention.

In order to resolve the above problem, the conventional invariable resistor 30 is replaced by a variable resistor so that the slope of the voltage inputted as the gradation data can be varied to match the laser diode characteristic. FIG. 3 shows a manner of variation of the gradation data voltage. The regulation is performed at two points, that is, at the maximum and minimum points of the laser power gradation, as shown in FIG. 6. Because of the circuit structure, at first the influence of REF data is nulled, then, regulation of the maximum point of the Vr voltage, namely the point A of the maximum gradation value, is performed by the variable resistor 29 serving as the first laser power regulation means. Subsequently, the regulation of the point B of the minimum gradation value, which corresponds to a condition in which all of REF data are inputted, is performed by the variable resistor B 30 serving as the second laser power regulation means. Accordingly, through the regulating of the two parameters of magnitude and slope of the laser power, a gradation characteristic which is free from characteristic variability inherent to laser diodes can be obtained.

According to the present invention, since the laser power is regulated between two predetermined gradation points, as in the above-described embodiment, the gradation variation characteristic is free from characteristic variability inherent to the laser diode, thereby, a possible variability in the laser power gradation characteristic between electrophotographic devices can be reduced. As a result, the present invention is advantageous for stabilizing the image quality which is a final output. In particular, the present invention is very effective for a system in which the image quality is stabilized, while varying the laser power depending on such factors as the operating condition and the use environment of the electrophotographic device.

Further, any laser diodes of a standard specification from a variety manufacturers can be used, and no special specifications are required for the laser diodes, which is advantageous for enhancing mass productivity and for cost reduction.

We claim:
1. An electrophotographic device comprising:
   laser beam emission control means which turns ON/OFF a laser beam in accordance with image data signals;
   an optical unit which converges the laser beam into a predetermined spot diameter to perform scanning;
   a photosensitive body;
   a developer which develops an electrostatic latent image formed on the photosensitive body with toner;

an intermediate transfer body for overlapping toner images formed on the photosensitive body;

transfer means which transfers the toner images onto a recording medium; and a fixing unit which fixes the toner images on the recording medium by heating and pressing the recording medium;

wherein the laser beam emission control means includes laser power output control means which controls a laser power of the laser beam at a predetermined output, and laser power gradation setting means which sets a gradation characteristic of the laser power;

wherein in order to reduce variability in a laser power gradation characteristic between electrophotographic devices, the laser beam emission control means further includes first laser power regulating means which regulates a magnitude of the laser power output, and second laser power regulating means which regulates a slope of the laser power gradation characteristic; and wherein laser power regulation is performed at two predetermined gradation points.

2. An electrophotographic device according to claim 1, wherein the photosensitive body is a single photosensitive body on which a plurality of toner images to be overlapped on the intermediate transfer body are successively formed.

* * * * *